(12) United States Patent
Young et al.

(10) Patent No.: US 11,880,139 B2
(45) Date of Patent: Jan. 23, 2024

(54) PHOTOLITHOGRAPHY SYSTEM INCLUDING SELECTIVE LIGHT ARRAY

(71) Applicant: Honeywell Federal Manufacturing & Technologies, LLC, Kansas City, MO (US)

(72) Inventors: Barbara Diane Young, Raymore, MO (US); Steven James Sedlock, Raymore, MO (US); Gregory Layton Lane, Jr., Lee's Summit, MO (US); Kevin Christopher Ledden, Raymore, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 28 days.

(21) Appl. No.: 17/482,992

(22) Filed: Sep. 23, 2021

(65) Prior Publication Data
US 2023/0092166 A1    Mar. 23, 2023

(51) Int. Cl.
G03F 7/00       (2006.01)
H01L 21/027    (2006.01)

(52) U.S. Cl.
CPC ...... *G03F 7/70275* (2013.01); *G03F 7/70008* (2013.01); *G03F 7/70575* (2013.01); *H01L 21/0274* (2013.01)

(58) Field of Classification Search
CPC ............. G03F 7/70275; G03F 7/70008; G03F 7/70575; G03F 7/70391; H01L 21/0274; H01F 38/42; G01R 22/06; G01R 31/382; G01R 31/40; G01R 31/64
See application file for complete search history.

(56) References Cited

U.S. PATENT DOCUMENTS

| | | | |
|---|---|---|---|
| 6,985,655 B2 | 1/2006 | Yamamoto | |
| 8,845,163 B2 | 9/2014 | Stites et al. | |
| 9,128,387 B2 | 9/2015 | Shih et al. | |
| 10,665,749 B2 | 5/2020 | Zhang et al. | |
| 2002/0075490 A1 | 6/2002 | Chappell | |
| 2006/0161287 A1 | 7/2006 | Simonis | |
| 2007/0127109 A1* | 6/2007 | Ishii | G03F 7/70291 359/292 |
| 2008/0111983 A1 | 5/2008 | Singer et al. | |

(Continued)

OTHER PUBLICATIONS

"Use DLP 3D Printer to Etch a PCB"; Electronoobs; http://electronoobs.com/eng_circuitos_tut25.php; Retrieved Jun. 16, 2021.

*Primary Examiner* — Deoram Persaud
(74) *Attorney, Agent, or Firm* — Erise IP, P.A.

(57) ABSTRACT

A system, device, and method for imparting or transferring a geometric pattern on the surface of a substrate. The device comprises, a housing forming at least a partially enclosed space, a light source body comprising an array of light emitters, a base disposed below the light source body and configured for supporting the substrate having a photoresist layer thereon, and a controller for activating a predetermined number of individual light emitters corresponding to the predetermined geometric pattern. Each individual light emitter within the array of light emitters is selectively activatable to emit a light. The array of light emitters comprises a plurality of light-emitting diodes, a plurality of quantum dots, or both.

22 Claims, 5 Drawing Sheets

(56) References Cited

U.S. PATENT DOCUMENTS

| | | | | |
|---|---|---|---|---|
| 2010/0020299 A1* | 1/2010 | Zebala | ................ | G03F 7/70291 |
| | | | | 355/67 |
| 2013/0065185 A1* | 3/2013 | Flagello | .............. | G03F 7/70325 |
| | | | | 430/322 |
| 2014/0238958 A1* | 8/2014 | Zafiropoulo | ......... | B23K 26/352 |
| | | | | 219/121.6 |
| 2014/0300877 A1* | 10/2014 | Menon | ...................... | G03F 7/70 |
| | | | | 355/53 |
| 2018/0004095 A1* | 1/2018 | Tukker | ...................... | F21V 9/30 |
| 2018/0136567 A1* | 5/2018 | Moriya | ............... | G03F 7/70725 |
| 2019/0294051 A1* | 9/2019 | Johnson | .............. | G03F 7/70383 |

* cited by examiner

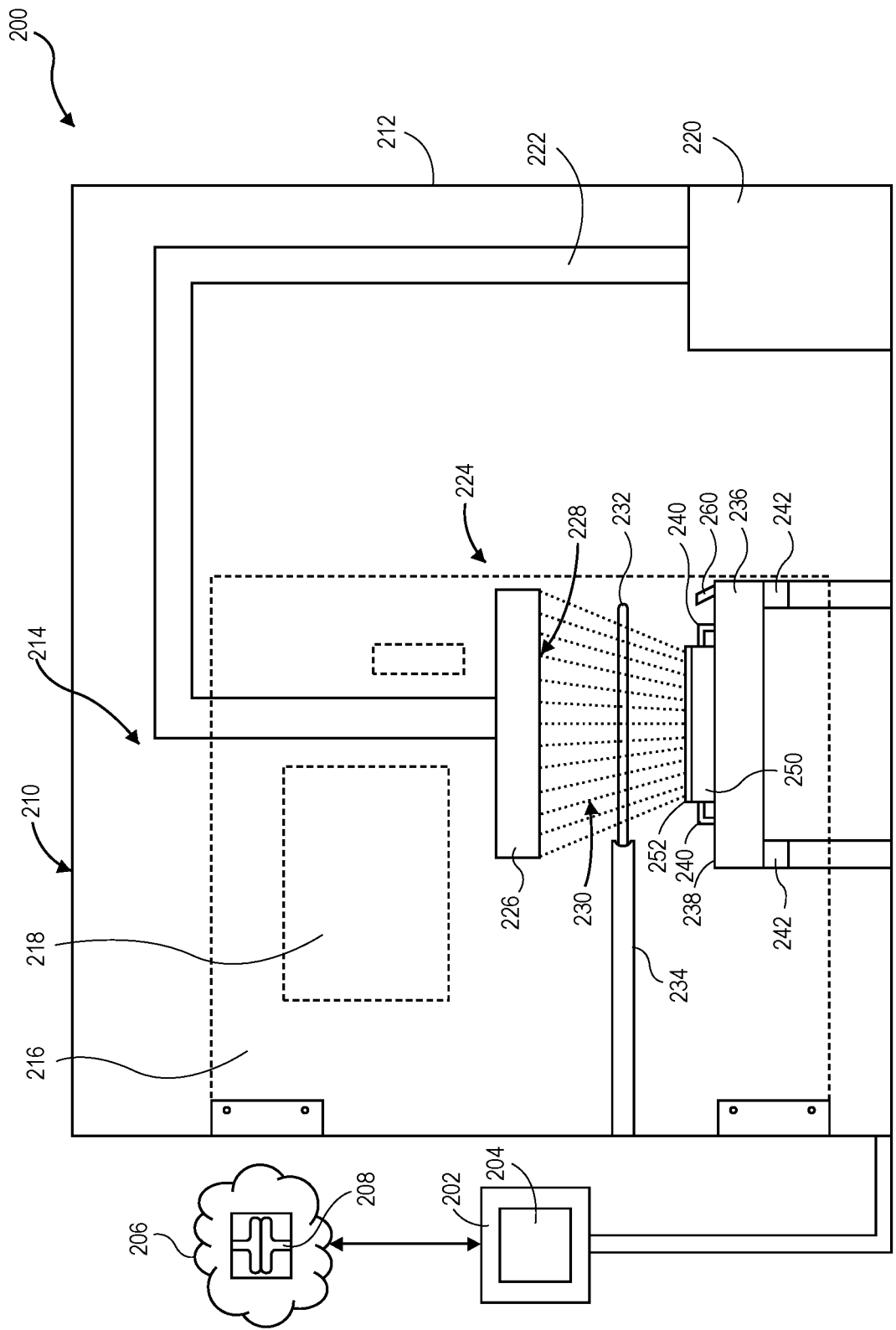

PHOTOLITHOGRAPHY SYSTEM INCLUDING SELECTIVE LIGHT ARRAY

STATEMENT OF GOVERNMENTAL SUPPORT

This invention was made with government support under DE-NA0002839 awarded by the United States Department of Energy/National Nuclear Security Administration. The government has certain rights in the invention.

BACKGROUND

1. Field

Embodiments of the invention relate to mask-less photolithography systems and methods. Specifically, the present invention is directed to photolithography systems that utilizes a light source array that provides simultaneous exposure of the entire surface of a substrate.

2. Related Art

In the manufacturing of semiconductor devices, photolithography is oftentimes used to transfer a geometric design to a wafer or substrate. Traditionally, the first step of photolithography comprises the creation of a photomask. Following the creation of the photomask, light beams are uniformly directed to the photomask, with light passing through holes or transparencies in the photomask and onto a photosensitive material on the surface of a substrate, thereby transmitting a pattern on the substrate corresponding to the transparent areas of the mask. The exposure of the photosensitive material on the surface of the substrate to light caused a chemical reaction, thereby imparting a geometric pattern on the photosensitive material on the surface of the substrate.

Mask-less photolithography is typically reserved for the creation of prototype semiconductor devices due to the long exposure times required to complete the process. In these mask-less methods, wafers or substrates are directly exposed by a light source with a direct write system, eliminating the photomask process, i.e., directly exposing the substrate with a laser or electron beam, for example. However, current direct write systems are extremely slow, exposing only a narrow strip of the substrate at a time. For example, a single 150 mm substrate may take up to 8 hours to fully expose. Furthermore, such methods are also limited in that the resolution of the geometric pattern on the substrate is determined by the beam width. Such long exposure times, increase the risk of the beam of light being knocked off course due to vibrations created during the process. Such long exposure times further lead to inherent inefficiencies of mass-producing substrates.

Attempts to improve mask-less photolithography systems, such as by increasing the power or intensity of the beam of light, or other adjustable parameters, create new problems rather than solving existing problems and are dependent on the photosensitive material. For example, increasing the power output or intensity of the laser to speed up the process can cause burns or scorching on the wafer. Such damage may be irreversible and lead to an unusable wafer. Accordingly, a need exists for a mask-less photolithographic method that can reduce the amount of time needed to fully expose a wafer and improve the efficiency of manufacturing the wafer.

SUMMARY

Embodiments of the invention solve the above-mentioned problems by providing a system and method for exposing the entirety of a geometric pattern on a substrate surface simultaneously. A light source having an array of light emitters, wherein each light emitter is selectively activatable and transfers the entirety of the geometric pattern to the substrate without the use of a photomask.

A first embodiment of the invention is directed to a photolithography device for imparting a predetermined geometric pattern on a surface of a substrate. The device comprises a housing forming at least a partially enclosed space; a light source body comprising an array of light emitters; a base disposed below the light source body and configured for supporting the substrate having a photoresist layer thereon; and a controller for activating a predetermined number of individual light emitters within the array of light emitters corresponding to the predetermined geometric pattern. Each individual light emitter within the array of light emitters is selectively activatable to emit a light.

Another embodiment of the invention is directed to a system for transferring a predetermined geometric pattern to a surface of a substrate through photolithography, comprising: a control system comprising at least one design file comprising the predetermined geometric pattern; and a photolithographic device. The photolithographic device comprises a light source comprising a light source body and a plurality of light emitters; and a base for supporting a substrate having a photoresist on an upper surface thereof. Each light emitter within the plurality of light emitters is individually activatable to emit a light and the light source is configured for simultaneously emitting the light from the plurality of light emitters towards the substrate. The plurality of light emitters is selected for activation by instructions contained in the at least one design file.

Another embodiment of the invention is directed to a method of transferring a geometric pattern to the surface of a substrate, the method comprising: receiving, from a design file, a geometric pattern; selecting, from a light source having an array of light emitters, light emitters corresponding to the geometric pattern; activating the light emitters corresponding to the geometric pattern to simultaneously emit a light; exposing a predetermined area of a surface of a substrate having a photoresist layer with the light emitted from the activated light emitters; deactivating the activated light emitters to stop exposing the substrate with light; and removing an unexposed portion of the photoresist layer from the substrate. The predetermined area of the surface of the substrate corresponds to the geometric pattern and exposing the predetermined area of the surface of the substrate causes a chemical reaction between the light emitted and the photoresist layer exposed by the light.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 1 is a perspective view of a first embodiment the photolithographic system of the invention showing the interior of the photolithographic device;

Figure 2B:
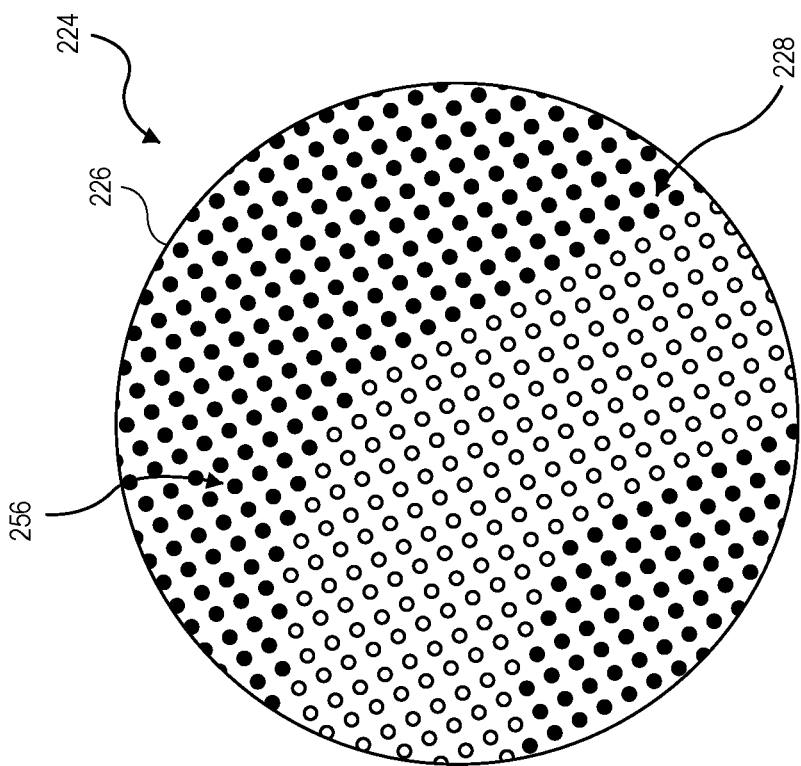
FIG. 2B is a bottom side view of a second embodiment of a portion the light source body comprising quantum dots.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description of embodiments of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the present technology can include a variety of combinations and/or integrations of the embodiments described herein.

FIG. 1 illustrates an exemplary system 200 including a photolithographic device 210 and a control system 202. Photolithographic device 210 is configured for transferring, imparting, or otherwise transferring a geometric pattern 208 onto one or more substrates 250.

Photolithographic device 210 may comprise at least one light source 224 for emitting a light. As described in greater detail below, light source 224 may comprise a variety of different light sources, and for example, may be a light-emitting diode (LED), liquid crystal display (LCD), quantum dots, ultraviolet light, or other light sources. In some embodiments, light source 224 may be used for exposing a substrate 250 with light for photolithography. In some embodiments, multiple light sources 224 may be used in conjunction with each other. For example, light source 224 may comprise a combination of LEDs, quantum dots, and/or other light sources for exposing the surface of a substrate 250.

In some embodiments, light source 224 may comprise a light source body 226 for housing or supporting one or more light emitters 228. In some embodiments, light source body 226 comprises any design, and for example may be substantially planar, concave, or convex. Furthermore, light source body 226 may comprise any geometric shape, and for example, may comprise a generally cylindrical, triangular, rectangular, pentagonal, or any other polygonal shape. In some embodiments, the geometric design of light source body 226 may be dependent on the shape of the substrate. As described in greater detail herein, light source 224 may be used to expose the entire surface of a substrate 250 used in the photolithographic process. Accordingly, in some embodiments, light source body 226 may have dimensions that are greater than the substrate 250. For example, in some embodiments, light source body 226 may have a dimension having a 25% greater surface area than the dimensions of the substrate. In further embodiments, light source body 226 may have a dimension having a 50% greater surface area than the dimensions of the substrate. However, it will be appreciated that light source body 226 may have any dimensions that are larger than the dimensions of the substrate 250. For example, if a substrate has a diameter of about 6 inches, then light source body 226 may have a diameter of about 7.5 inches. Accordingly, the area that may be exposed by light emitted from light source 224 may be substantially larger than the actual area of the substrate 250. Furthermore, to expose the area of substrate 250, only the light emitters 228 corresponding to the size of substrate 250 would need to be activated.

Light source body 226 may further act as a housing or storage unit for one or more light emitters 228, for creating, generating, and emitting a light 230 that may be directed towards one or more substrates. In some embodiments, there may be a plurality or an array of light emitters 228 located in light source body 226. Light source emitters 228 may be cooperatively coupled within light source body 226 for connection with connector 222. Through such a coupling, electricity or energy from energy source 220 may be transferred to light emitters 228, thereby energizing light emitters 228 for generating light 230. Following the energizing of light emitters 228, light 230 may then be generated from light emitters 228 and directed towards a substrate 250 for imparting geometric pattern 208 on the surface of substrate.

In some embodiments, light 230 may have an unobstructed pathway from light source body 226 to a substrate 250. In further embodiments, a reduction lens 232 or other focusing apparatus may be placed between light source body 226 and substrate 250. In some embodiments, reduction lens 232 may be a focusing lens, aiding in focusing and/or reducing the size of light 230 and allowing for increased accuracy in exposing the geometric pattern 208 on the substrate 250. Furthermore, such focusing and/or reducing of the size of light 230 may aid in reducing defects and/or improving resolution of the geometric pattern 208 on the substrate 250. In some embodiments, reduction lens 232 may act as a reducer of the size of light 230 and, for example, may reduce the size of light 230 from about two times to about ten times in size. For example, if light source 224 is configured for resolving a 1 µm line, then with a 2× reduction lens 232, light 230 may be reduced for resolving a 0.5 µm line. Accordingly, through such a reduction, a 1 µm defect would become a 0.5 µm defect. Reduction lens 232 may be constructed from any known lens material, including but not limited to glass. In some embodiments, reduction lens 232 may be attached, secured, or otherwise connected to housing unit 212. For example, one or more supports 234 may be implemented that secure reduction lens 232 to housing unit 212. In some embodiments, supports 234 may be scaffolding or beams. However, it will be appreciated that supports 234 may be any other known methods of holding reduction lens 232 in place.

System 200 may further comprise a base or platform 236, which may be used for placing or holding a substrate 250 during a photolithographic process. Platform 236 may comprise a substantially planar design, having a top receiving surface 238 for placement of a substrate 250. Platform 236 may comprise any geometric shape or design, and for example, may be a circle, triangle, square, pentagon, or other polygonal shape. Platform 236 may also comprise one or more attachment apparatus 240, for holding or securing a substrate in place. For example, in some embodiments, attachment apparatus 240 may be clamps, an indented receptacle, a vacuum system, or other mechanical methods of securing a substrate in place during operation of photolithographic device 210. In some embodiments, platform 236 may further include one or more stabilizers for maintaining a level of substrate during operation of photolithographic device 210. For example, shock absorbers 242 may be placed in platform 236 for reducing or eliminating movement of platform 236 and for keeping substrate level and in place during operation.

As further illustrated in FIG. 1, substrate 250, such as a wafer, may be placed on receiving surface 238 of platform 236. In some embodiments, substrate 250 may be secured in place by attachment apparatus 240 during operation. Substrate 250 may be any known substrate for photolithographic processes that is known in the art, or which may be discovered. For example, substrate 250 may be a thin slice of semiconductor, such as a crystalline silicon, used for the fabrication of integrated circuits. Substrate 250 may serve as a base, platform, or build plane for microelectronic devices to be built in and upon. In some embodiments, substrate 250 can be made or constructed from silica, glass, phosphides, alumina, aluminum nitride, glass, low temperature co-fired ceramic, or other semi-conductor material, or any other material known or yet to be discovered that can be used in photolithographic processes. In some embodiments, substrate 250 may comprise more than one layer of material, and for example, may comprise a plurality of layers of thin metal films, dielectrics, diffusion windows, vias, among other materials. For example, in some embodiments, different layers of substrate 250 may be exposed with light 230. Substrate 250 may comprise varying dimensions, and for example may have a diameter or a length of about 0.025 inches to about 15 inches, by way of non-limiting examples. Furthermore, substrate 250 may comprise varying thicknesses, and, for example, may be about 100 μm to about 1 millimeter thick. Substrate 250 may further comprise a photoresist 252, phototool, photoactive polymers, biologic media, photo-definable polyimide, photo-definable BCB (benzocyclobutene), or other photoactive compounds applied at least one surface of substrate 250. Photoresist 252 may be an organic, light-sensitive material, that reacts to light 230 causing a chemical reaction when exposed thereto, allowing part of the light-sensitive material to develop away in a subsequent develop process. Photoresist 252 may comprise varying dimensions, and for example may be about 0.1 μm to about 50 μm thick. Furthermore, in some embodiments photoresist 252 may substantially cover a surface of substrate 250. In some embodiments, photoresist 252 may cover about 25% to about 50%, from about 50% to about 75%, or from about 75% to about 100% of a surface of substrate 250. Additionally, the thickness of photoresist 252 may be dependent on a variety of factors, including the composition of photoresist 252. It will be appreciated that, as the state of the art changes, and photoresist compositions change, the light source 224, being either quantum dots or LEDs or another light emitter type, can be modulated to account for different exposure requirements of the photoresist 252.

In some embodiments, photolithographic device 210 may comprise one or more energy sources 220, which generate energy for activating one or more light sources 224 for transferring a geometric pattern 208 on a substrate. As described in greater detail herein, photolithographic device 210 may utilize a variety of different sources of light, including but not limited to ultraviolet light, quantum dots, irradiated light, or other light sources, that are either known in the art or have yet to be discovered. In some embodiments, different sources of light may be used in conjunction. Accordingly, energy source 220 may vary depending on the embodiment, and for example, may transfer energy from an external source, such as battery or standard electrical outlet. In some embodiments, energy source 220 may be located within housing unit 212, for example, if energy source 220 is a battery. Alternatively, in some embodiments, energy source 220 may be located external to housing unit 212, for example if energy source 220 is a standard electrical outlet or external energy source 220. In some embodiments, control system 202 may be used to activate or deactivate energy source 220, control the amount of energy output, or control other operational parameters of energy source 220 during use. In some embodiments, the same energy source 220 may be utilized for different light sources 224, including for example, light sources 224 comprising either LED or quantum dot light emitters 228. In some embodiments, energy source 220 may be a low voltage and low current direct current (DC) control source. For example, energy may be derived from a switching voltage source that could operate over a range of about 85 V to about 230 V. However, the range may be extended for alternate embodiments.

In some embodiments, photolithographic device 210 may further comprise at least one connector 222 for transferring energy from energy source 220 to a light source. In some embodiments connector 222 may be wiring, cables, coils, or other conductive circuitry capable of transferring an electrical energy output from energy source 220. In some embodiments, connector 222 may be located entirely within housing unit 212. In further embodiments, connector 222 may be partially located within housing unit 212 and partially external to housing unit 212.

In some embodiments, photolithographic device 210 may comprise a housing unit 212. Housing unit 212 may comprise a frame for supporting and at least partially enclosing the components of photolithographic device 210. In some embodiments, housing unit 212 may generally be designed as a rectangular enclosure, however, it will be appreciated that housing unit 212 may be designed in any geometric shape or design, such as cylindrical or square. Furthermore, the dimensions of housing unit 212 may likewise vary depending on the embodiment, and for example, may be configured based on the dimensions of the substrates or wafers used in the photolithographic process. For example, in some embodiments, housing unit 212 may comprise the following dimensions: a length of about 24 inches to about 84 inches; a width of about 24 inches to about 84 inches; and/or a height of about 24 inches to about 84 inches.

Housing unit 212 may be constructed from any suitable material, including but not limited to metallic alloys such as aluminum, magnesium, titanium, stainless steel, or other known structural frame materials.

In some embodiments, housing unit 212 may support at least one panel 214 thereon. In further embodiments, multiple panels 214 may be placed in housing unit 212. Panels 214 may provide a partially or fully closed-housing unit design to aid in protecting the substrate during operation and for preventing a person from contacting the inside of photolithographic device 210 during operation. As described in greater detail herein, in some embodiments, system 200 may utilize ultraviolet light sources or other irradiated or energized light sources. Accordingly, in some embodiments, panels 214 may be constructed from any suitable material, including but not limited to metallic alloys, such as aluminum, magnesium, titanium, stainless steel, or other known materials, that can block ultraviolet light or other forms of light from escaping from housing unit 212, thereby protecting observers or persons located near photolithographic device 210. For example, panels 214 may be composed of at least one material having certain properties to prevent the release of ultraviolet light from housing unit 212. In further embodiments, panels 214 may be constructed from a combination of materials having properties to prevent the release of ultraviolet light from housing unit 212. In some embodiments, at least one interior surface of panel 214 may include a reflective or protective material. In some embodiments, the protective material may be applied as a lining or additional layer and may be manufactured into panels 214 or may be applied as a coating on a surface of panels 214.

In some embodiments, housing unit 212 may further comprise at least one means for accessing the interior of housing unit 212, such as one or more doors 216 or a hatch. In some embodiments, doors 216 are configured with handles and rotate on hinges. In some embodiments, doors 216 may further comprise a viewing portal 218 or window for observing the interior of housing unit 212 during operation of photolithographic device 210. Viewing portal 218 may be constructed from any suitable transparent or translucent material and, for example, may be laminated safety glass. In some embodiments, viewing portal 218 may be located on one of panels 214. In some embodiments, there may be a plurality of viewing portals 218 located on door 216, panels 214, or any combination thereof. In some embodiments, the photolithographic device 210 automatically locks the door 216 to prevent a user from accessing the interior of photolithographic device 210 during operation.

In some embodiments, photolithographic device 210 may be communicatively coupled with control system 202 for utilizing a design file 206 during operation or for carrying out the operations of use. In some embodiments, control system 202 may be located externally and communicatively coupled to photolithographic device 210. In further embodiments, control system 202 may be directly connected to photolithographic device 210 through a wired connection, such as an ethernet cable, for example. Alternatively, in some embodiments, control system 202 may be wirelessly coupled to photolithographic device 210, through an indirect connection, such as WiFi or Bluetooth, for example. Alternatively, in further embodiments, control system 202 may be incorporated into photolithographic device 210. For example, in some embodiments, control system 202 may be attached or integrally connected to housing unit 212.

In some embodiments, system 200 may comprise control system 202 which may be encompassed in a computer, tablet, or other hardware, which, for example, may be any of the computing devices described with respect to FIG. 5 below. For example, control system 202 may be a desktop computer configured for storing data files, including instructions for manufacturing semiconductor devices, wafers, or other substrates. In some embodiments, control system 202 may comprise a processor, which may be configured to receive parameters for transferring a geometric pattern to a substrate or wafer in a photolithographic process. Control system 202 may further be used to control the operation of system 200 before and/or during operation. Control system 202 may further comprise a display, keyboard, or other interface for inputting instructions. For example, in some embodiments control system 202 may comprise a display. Display 204 may provide an interface for inputting instructions, such as a touch-screen interface. Display 204 may also provide any information to a user about system 200 before, during, and after operation. For example, display 204 may provide information that may be required for pre-operation, post-operation, diagnostic testing, and/or troubleshooting. In some embodiments, control system 202 may include an additional computing device 502 connected to system 200. In some embodiments, computing device 502 may allow a user to input additional instructions and is configured to interact with control system 202.

Furthermore, in some embodiments, a design file 206 may be transmitted, uploaded, or otherwise transferred and stored in control system 202. In some embodiments, design file 206 may be transmitted to control system 202 in file formats such as .stl, obj. or .amf, or any other file format created by a computer-aided design (CAD) program or software. In some embodiments, design file 206 may include a geometric pattern 208. Geometric pattern 208 may be a pattern that can be transferred or imparted onto the surface of a substrate, wafer, or other surface during a photolithographic process. Additionally, design file 206 may further comprise additional information such as tolerances, expansions, strength properties, etc. In some embodiments, design file 206 may further comprise instructions for carrying out a photolithographic process. For example, in some embodiments, a photoresist, substrate, or wafer may be constructed from a variety of different materials, each having unique or varying properties and design file 206 may include instructions or otherwise account for specific materials.

In some embodiments, control system 202 may be configured for storing a plurality of design files 206. For example, system 200 may be used to prepare a plurality of substrates 250, each having different geometric patterns 208. Accordingly, control system 202 may store a plurality of design files 206 each having a different geometric pattern 208 or instructions that may be specific to a substrate 250 or wafer. In some embodiments, design files 206 may be selectively switched-out or replaced, allowing for an efficient manner of transferring multiple geometric patterns 208 on multiple substrates in succession. For example, after transferring a first geometric pattern 208 on a first substrate 250, a new substrate 250 and a new design file 206 may be loaded, selected, and used by system 200.

Furthermore, in some embodiments, in addition to geometric pattern 208, design file 206 may further comprise instructions for positioning light source body 226 in relation to substrate 250 for imparting geometric pattern 208 in a predetermined location. For example, design file 206 may comprise instructions for positioning a center position of light source body 226 over a center portion of substrate 250. Light source body 226 may be automatically adjusted or positioned over the center position of substrate 250 in accordance with the instructions included with design file 206. By way of non-limiting example, design file 206 may comprise the dimensions of substrate 250, wherein light source body 226 may be positioned in accordance with the dimensions of substrate 250. In further embodiments, light source body 226, or photolithographic device 210, may comprise one or more sensors which may aid in positioning light source body 226. For example, light source body 226 may comprise a laser which can aid in positioning light source body 226. In further embodiments, light source body 226 may be manually positioned with respect to substrate 250 by a user or operator. The user or operator may manually position light source body 226 at a predetermined position relative to substrate 250, for exposing substrate 250 with light. In some embodiments, one or more sensors located on light source body 226 or other locations of photolithographic device 110 may aid the user or operator in manually positioning light source body 226.

Figure 2A:
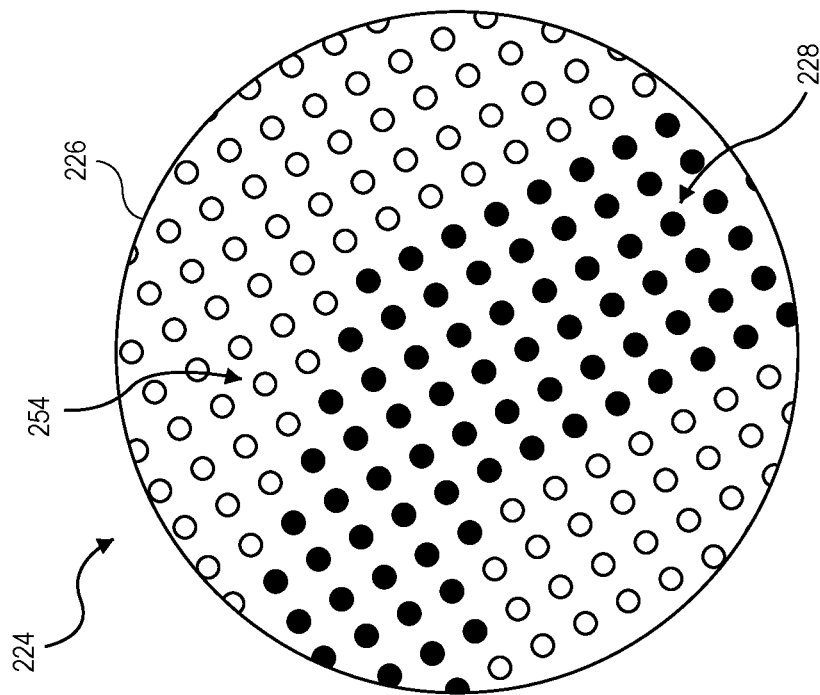
FIG. 2A is a bottom side view of a first embodiment of a portion of the light source body comprising light emitting diodes.

Turning now to FIGS. 2A-2B, the bottom side view of a portion of the light source body 226 is illustrated. In some embodiments, light source 224 may comprise a plurality of light emitters 228 placed throughout light source body 226. In some embodiments, light emitters 228 may be uniform in size for emitting light 230 having uniform wavelengths. In further embodiments, light emitters 228 may comprise varying or otherwise non-uniform sizes for emitting light 230 having non-uniform wavelengths. Furthermore, in some embodiments, light emitters 228 comprising varying sizes may be placed in a pattern, selectively placing specific size light emitters 228 to provide flexibility and customization on the placement of varying sized light emitters 228. It will be appreciated that while the illustrated embodiments depict light emitters 228 of uniform sizes, that in some embodiments, light source body 226 may comprise light emitters 228 of varying or otherwise non-uniform sizes. For example, in some embodiments, a light emitter 228 sized for emitting a beam of light 230 that is 180 nm may be placed next to a light emitter 228 sized for emitting a beam of light 230 that is 450 nm. The size of light emitters 228 may further be dependent at least in part on the light source being used. For example, light emitters 228 comprising an LED light source may be larger in size than light emitters 228 comprising a quantum dot light source.

In some embodiments, light source 224 may utilize a variety of different lights, which may affect exposure time, energy input, or other factors. However, each individual light emitter 228 within light source body 226 may be communicatively coupled to control system 202 and/or computing device 502. Through such connection, each individual light emitter 228 may be selectively controlled, and may be activated or remain inactive when light source 224 is supplied with an electrical current or power from energy source 220. In some embodiments, and as described in greater detail herein, such selective activation may eliminate the need of a photomask that is typically used in photolithography. Instead, the predetermined light emitters 228 may be selected corresponding to geometric pattern 208 for imprinting on the surface of substrate 250.

In some embodiments, and as illustrated in FIG. 2A, light source 224 may be a LED light source for exposing substrate with light 230 for use with a negative photoresist. While the illustrated embodiment in FIG. 2A depicts LEDs 254 for use with a negative photoresist application, LEDs 254 may alternatively be used in positive photoresist applications. For example, a plurality of LEDs 254 may be placed through light source body 226 for directing light 230 to substrate 250. In some embodiments, LEDs 254 may be coupled to energy source 220, wherein electricity or other power generated from energy source 220 may be transmitted to light source 224, thereby activating LEDs 254 from a passive, non-active state. After activation, light 230 may be emitted from LEDs 254 and directed towards substrate 250. LEDs 254 may be selected from a variety of different sizes and in some embodiments, uniform sizes of LEDs 254 may be placed in light source body 226. For example, in some embodiments, a specific light source body 226 may having LEDs of only 180 nm in size. If a larger size of LEDs is required, light source body 226 may be replaced with another light source body 226 having LEDs of a different size, such as 450 nm, for example. Accordingly, light source body 226 may be an optionally removable and/or replaceable component of photolithographic device 210. In further embodiments, light source body 226 may comprise a plurality of LEDs 254 having varying, or otherwise non-uniform sizes. For example, in some embodiments, light source body 226 may comprise a plurality of LEDs 254 having sizes from about 180 nm in size to about 450 nm in size. In some embodiments, LEDs 254 having varying sizes may be arranged in pre-determined patterns or layouts for increasing flexibility and custom patterns.

In some embodiments, and as illustrated in FIG. 2B, light source 224 may be a quantum dot light source for exposing substrate 250 with light 230 for use with a positive photoresist. While the illustrated embodiment in FIG. 2B depicts quantum dots 256 for use with a positive photoresist application, quantum dots 256 may also be used in negative photoresist applications. In some embodiments, light emitters 228 may be a quantum dot light source for exposing substrate 250 with light 230. For example, a plurality of quantum dots 256 may be placed through light source body 226 for directing light 230 to substrate 250. In some embodiments, quantum dots 256 may be coupled to energy source 220, wherein electricity or other power generated from energy source 220 may be transmitted to light source 224, thereby activating quantum dots 256 from a passive, non-active state. After activation, light 230 may be emitted from quantum dots 256 and directed towards substrate 250. Similar to the embodiments described above with respect to LEDs 254, a plurality of quantum dots 256 may be placed and secured within light source body 226. Furthermore, in some embodiments, quantum dots 256 may be uniform in size, or alternatively, may comprise non-uniform or varying sizes. For example, in some embodiments, quantum dots 256 may uniformly be about 2 nm in size. In further embodiments, the plurality of quantum dots 256 may be chosen from a range of 2 nm in size to about 9 nm in size. Furthermore, similar to LEDs 254 described above, quantum dots 256 having varying sizes may be arranged in pre-determined patterns or layouts for increasing flexibility and custom patterns.

Quantum dots 256 as used herein refer to semiconductor particles that are small enough that quantum effects come into play. In some embodiments, quantum dots 256 may comprise a core, which can determine the properties of the quantum dots 256. For example, the quantum dot core may comprise an indium-phosphide, cadmium selenide, lead, or other metals. The field of study of quantum dots is a rapidly developing area, with new methods and processes of making quantum dots developing at a rapid pace. For example, present methods of synthesizing quantum dots include, colloidal synthesis, plasma synthesis, fabrication, viral assembly, electrochemical assembly, bulk-manufacture, and heavy-metal-free quantum dots. Accordingly, the present invention is not directed to any one method of creating quantum dots, or quantum dots having a specific core, but is meant to cover quantum dots now known or yet to be discovered.

In some embodiments, the wavelength of the emitted light 230 may be dependent in part on the properties of quantum dots 256. For example, the wavelength of quantum dots 256 may be highly variable, and may reside within the visible spectrum of light or the ultraviolet spectrum of light. In some embodiments, the wavelength may be determined at least in part on the size of quantum dots 256. For example, a quantum dot 256 having a core size of 2 nm may have a wavelength that corresponds to blue in the visible spectrum. By way of another example, a quantum dot 256 having a core size of 7 nm may have a wavelength that corresponds to red in the visible spectrum.

In some embodiments, photolithographic device 210 may further comprise at least one sensor 260, for monitoring the photolithographic process. For example, sensor 260 may be configured to monitor the wavelength of light 230 emitted from the one or more light emitters 228 for quality assurance purposes. In some embodiments, sensor 260 may be configured for monitoring the color of quantum dots 256 during the photolithographic process. Such monitoring through sensor 260 may aid in quality assurance and to ensure that photolithographic device 210 is operating properly. In some embodiments, sensor 260 may be located entirely within housing unit 212. In further embodiments, sensor 260 may be located external to housing unit 212.

Figure 3C:
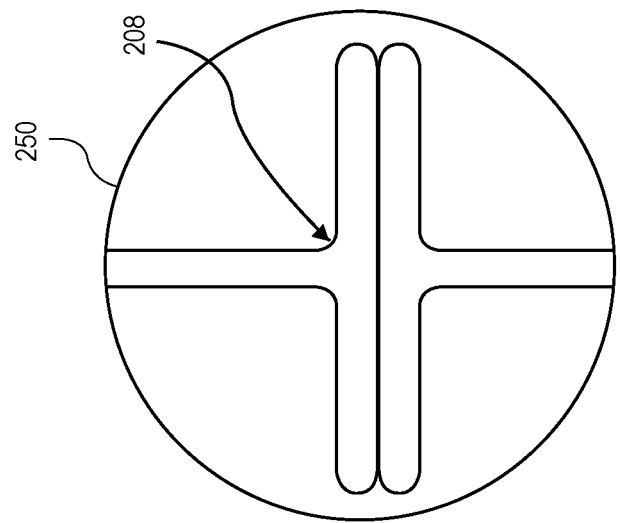
FIG. 3C is a top side view of a final substrate with a geometric pattern transferred to the surface of the substrate.
Figure 3B:
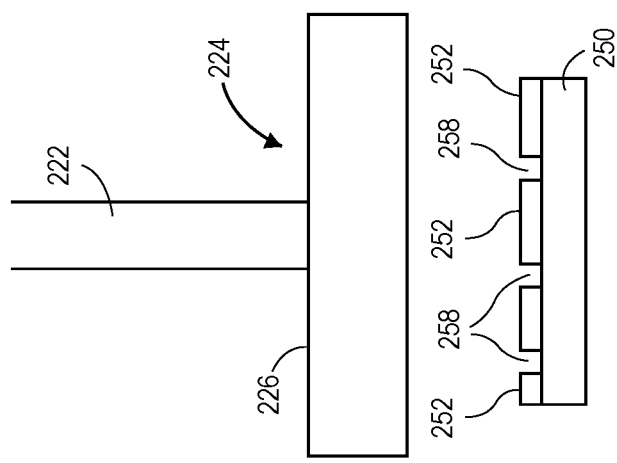
FIG. 3B is a perspective view of a substrate and photoresist after light exposure.
Figure 3A:
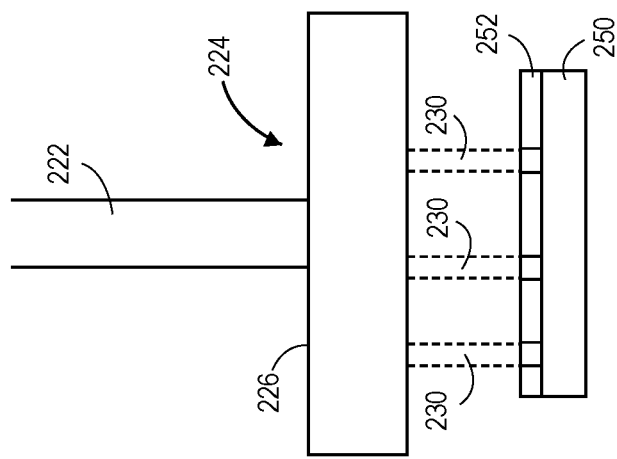
FIG. 3A is a perspective view of a substrate and photoresist during light exposure.

Turning now to FIG. 3A-C, an exemplary process of imparting a geometric pattern 208 on the surface of substrate 250 is depicted. In some embodiments, geometric pattern 208 may be imparted on the surface of a substrate 250 through a chemical reaction between light 230 and a positive acting photoresist 252. As depicted in FIG. 3A, in some embodiments, energy from energy source 220 may be transferred to light source body 226 for providing power or energy to activate one or more light emitters 228. In some embodiments, and as described herein, predetermined light emitters 228 may be activated corresponding to a geometric pattern 208 of design file 206. Light 230 may then be emitted from all the activated light emitters 228 simultaneously and directed to substrate 250 and photoresist 252, thereby imparting, transferring, or etching the entirety of geometric pattern 208 onto substrate 250 at one time.

Turning now to FIG. 3B, an exemplary embodiment of an after-developed substrate 250 and photoresist is illustrated. Following the exposure of photoresist 252 by light 230, the exposed portions of photoresist may undergo a chemical change, resulting in a chemically treated area 258. In some embodiments, photoresist 252 may be a positive photoresist which following exposure and chemical reaction, becomes soluble. In further embodiments, photoresist 252 may be a negative photoresist, wherein unexposed regions are soluble. Both positive and negative photoresists are contemplated herein. In some embodiments, chemically treated area 258 may comprise a continuously connected design, corresponding to geometric pattern 208. In further embodiments, chemically treated area 258 may comprise a non-continuous, or an otherwise segmented design. Regardless of whether chemically treated area 258 is continuous or segmented, it is contemplated herein that chemically treated area 258 may correspond with geometric pattern 208.

FIG. 3C illustrates a top view of a treated substrate 250 with geometric pattern 208 imprinted upon, illustrating an exemplary geometric pattern 208. As described in greater detail below, following the chemical reaction between light 230 and photoresist 252, the geometric pattern 208 may be transferred or imparted on substrate 250. In some embodiments, for example with a negative photoresist, the portions of photoresist 252 that were not exposed to light 230 may be removed from the surface of substrate 250. In further embodiments, for example with a positive photoresist, the portions of photoresist 252 that were exposed to light 230 may be removed from the surface of substrate 250. For example, in some embodiments, photoresist 252 may be removed through a chemical solution designed to remove the photoresist 252. However, any method of removing a portion of photoresist 252 from substrate 250 may be employed. Following removal of photoresist 252 from substrate 250, geometric pattern 208 may be the only remaining object on the surface of photoresist 252, as illustrated in FIG. 3C.

Figure 4:
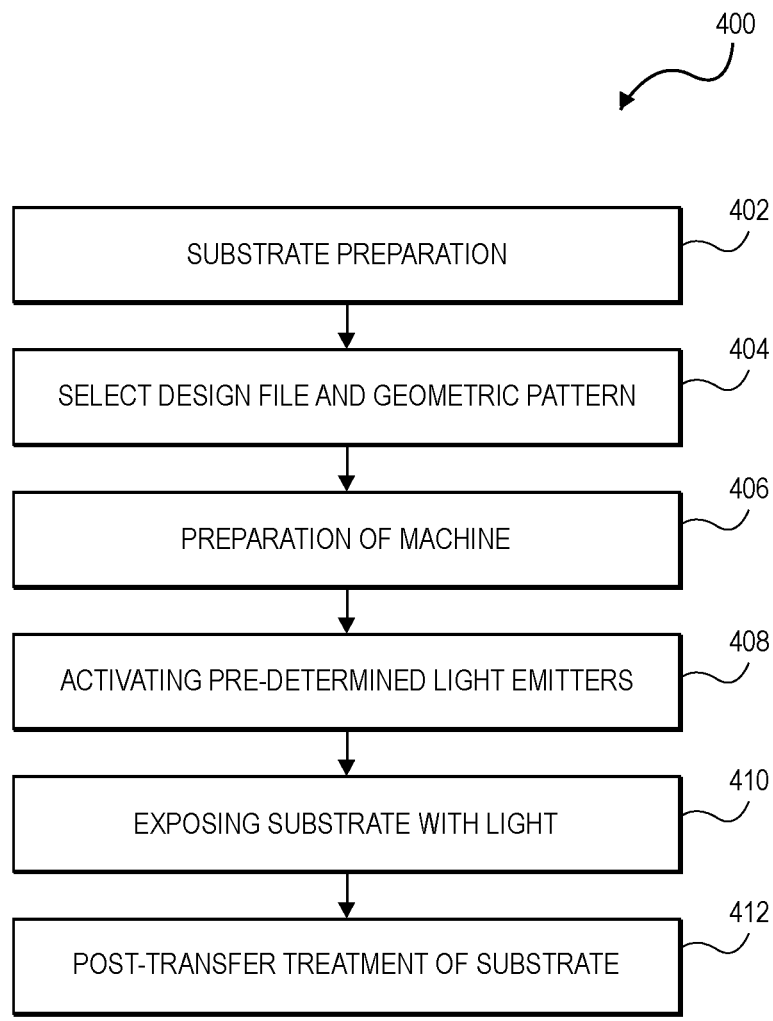
FIG. 4 is an exemplary flowchart illustrating a method of using the photolithographic device of the invention.

Turning now to FIG. 4, a method 400 of an exemplary photolithographic process for transferring a geometric pattern 208 onto the surface of a substrate 250 is depicted in a flowchart. In some embodiments, at a step 402 a substrate 250 may be prepared for the photolithographic process. For example, preparation of substrate 250 may include cleaning and/or sanitizing substrate 250 to remove any organic or inorganic contaminations that may be present on the surface of substrate 250. Substrate 250 may be cleaned using any known treatment methods, including but not limited to a wet chemical treatment comprising hydrogen peroxide, trichloroethylene, acetone or methanol can also be used to clean. Preparation 402 may optionally or further consist of heating substrate 250 to a temperature that is high enough to drive off any moisture that may be present on the substrate 250 surface. For example, in some embodiments, a temperature of about 150° C. may be sufficient to drive off any moisture. Additionally, preparation 402 may optionally or further consist of maintaining the heating of substrate 250 for a predetermined length of time. For example, in some embodiments, substrate 250 may be heated to a temperature of about 150° C. for about ten minutes.

Preparation 402 may optionally or further comprise treating the substrate 250 to promote adhesion of photoresist 252 to the substrate 250. In some embodiments, a solution, such as hexamethyldisilazane or other adhesion promoting solutions, may be applied to a surface of the substrate to promote adhesion of photoresist 252 to substrate 250. The surface of substrate 250 may then react with hexamethyldisilazane or other solution, forming a water repellent layer on the surface of substrate 250, or otherwise providing a water repellant property to substrate 250, which may aid in promoting a clearer or more defined pattern on substrate 250.

Preparation 402 may further comprise coating or applying at least one surface of substrate 250 with photoresist 252. In some embodiments, substrate 250 may be covered with photoresist 252 through spin coating, spraying, roller coating, dip coating, extrusion coating or other methods of applying a photoresist to a substrate. For example, the thickness of photoresist 252 may vary and may be dependent on a variety of factors. The thickness of photoresist 252 may be dependent on the light source used in the photolithography process, the composition of photoresist 252, the thickness of substrate 250, the material of substrate 250, any combination of the preceding factors, or other factors. For example, in some embodiments the thickness of photoresist 252 may be about 125 nm to about 500 nm.

Next, at step 404, geometric pattern 208 may be selected for etching, imparting, or otherwise transferring to the surface of substrate 250. In some embodiments, geometric pattern 208 may be selected from design file 206. For example, design file 206 may be selected from a plurality of design files 206 stored either in a memory of control system 202 or computing device 502. In further embodiments, design file 206 may be uploaded, transmitted, or otherwise transferred to control system 202 or computing device 502. In some embodiments, design file 206 may contain the geometric pattern 208 for etching, imparting, or transferring to substrate 250. For example, design file 206 may include instructions for the activation of one or more of the light emitters 228 corresponding to the selected geometric pattern 208 contained in design file 206.

Next, at step 406, photolithographic device 210 may be readied for operation. For example, machine preparation 406 may comprise powering on photolithographic device 210 or otherwise activating or starting energy source 220. In some embodiments, during machine preparation 406, substrate 250 may be placed on receiving surface 238 of platform 236 and secured in place. During machine preparation 406, diagnostics and/or testing of photolithographic device 210 may optionally and/or additionally take place. The diagnostics and testing of photolithographic device 210 may provide information directed to photolithographic device 210 prior to operation, including for example, that photolithographic device 210 is operating correctly.

Next, at step 408, after design file 206 has been selected and transferred to photolithographic device 210 and after photolithographic device 210 has been powered on, photolithographic process may begin. In some embodiments, photolithographic process 408 may include transferring energy from energy source 220 to light source 224 via connector 222. In some embodiments, once energy is transferred to light source 224, light 230 may be emitted immediately. In further embodiments, after energy is transferred to light source 224, light source 224 may be controlled by manual or automatic input for selectively emitting light 230, such as by control system 202.

Furthermore, photolithographic process 408 may additionally include the selective activation of one or more light emitters 228 housed in light source body 226. For example, in some embodiments, light source body 226 may be communicatively coupled to control system 202 and/or computing device 502. Through such coupling, the geometric pattern 208 of design file 206 may be transmitted or otherwise communicated to light source body 226. One or more light emitters 228 located within light source body 226 may then be selected for activation and one or more light emitters 228 may be selected to remain non-activated. In other words, in some embodiments, a predetermined number of light emitters 228 may be selected to emit light 230 and a predetermined number of light emitters 228 may be selected to not emit light 230. In some embodiments, the predetermined light emitters 228 selected for emitting light 230 may correspond to the geometric pattern 208 contained in design file 206, such as shown in FIGS. 2A, 2B and 3C. Photolithographic process 408 may further include the selection of the wavelength of the light 230 emitted from light emitters 228. For example, in some embodiments, light emitter 228 may be configured for emitting light 230 at a plurality of wavelengths. For example, the wavelength may be dependent at least in part on the material of photoresist 252, substrate 250, exposure, and/or time, among other factors. In some embodiments, light source body 226 may comprise light emitters 228 having a predetermined wavelength range of light 230 that may be emitted. Accordingly, in some embodiments, the instructions contained in design file 206 may include instructions for selecting and activating light emitters 228 and may include a selection of light emitters 228 capable of generating light 230 having a specific or predetermined wavelength.

Next, at a step 410, the geometric pattern 208 may be transferred to the surface of substrate 250. Following the activation or powering on of photolithographic device 210, the geometric pattern 208 may then be transferred or imparted on the surface of substrate 250. In some embodiments, light 230 may be emitted from each of the activated light emitters 228 and directed to the entire surface of substrate 250 simultaneously. Accordingly, in some embodiments, the entirety of geometric pattern 208 may be transferred to the surface of substrate 250 simultaneously. Thus, the entirety of geometric pattern 208 may be imprinted or transferred simultaneously, rather than intermittently. By exposing the entire surface of substrate 250 with light 230, and therefore the entire geometric pattern 208, pattern transferring 410 may be completed in a substantially shorter timeframe than prior photolithographic methods. For example, in some embodiments, pattern transferring 410 may be completed in about one minute. In further embodiments, pattern transferring 410 may be completed in about thirty seconds to about three minutes. The time period to complete pattern transferring 410 may be dependent on a variety of factors, including but not limited to, the material of photoresist 252, the thickness of photoresist 252, the wavelength of light 230, among other factors or combination of factors. As photoresist 252 is exposed with light 230, the exposure may cause a chemical change to photoresist 252, transferring or etching geometric pattern 208 on substrate 250. The specific chemical reaction that occurs may be dependent on whether photoresist is a negative or a positive resist, both of which are contemplated herein. Following the complete etching, imparting, or transferring of geometric pattern 208 on substrate 250, light emitters 228 may be turned off or otherwise deactivated.

Next, at a step 412, post-transfer treatment of substrate 250 may then occur. For example, in some embodiments, post-transfer treatment 412 of substrate 250 may include the application of a solution, including a liquid resist striper to chemically alter the non-exposed or otherwise non-chemically altered portions of photoresist 252. In further embodiments, the non-exposed portions of the photoresist may be removed by oxygen-containing plasma. It will be appreciated that in further embodiments, any known methods of removing portions of a photoresist 252 may be used.

Following completion of step 412, a new substrate 250 may be selected and placed within photolithographic device 210 and process as described above with respect to steps 402 through 412 may be repeated. In some embodiments, the same geometric pattern 208 may be used multiple times, by using the same design file 206 over multiple processes. Alternatively, if a substrate 250 requires a different geometric pattern, then a new geometric pattern 208 may be selected by selecting a new design file 206. Accordingly, through the use of design files 206, substrates 250 comprising multiple geometric patterns 208 may be rapidly produced, through the selection of a new design file 206. Such versatility of selecting design files and geometric patterns may drastically improve efficiency in mass producing substrates 250.

Figure 5:
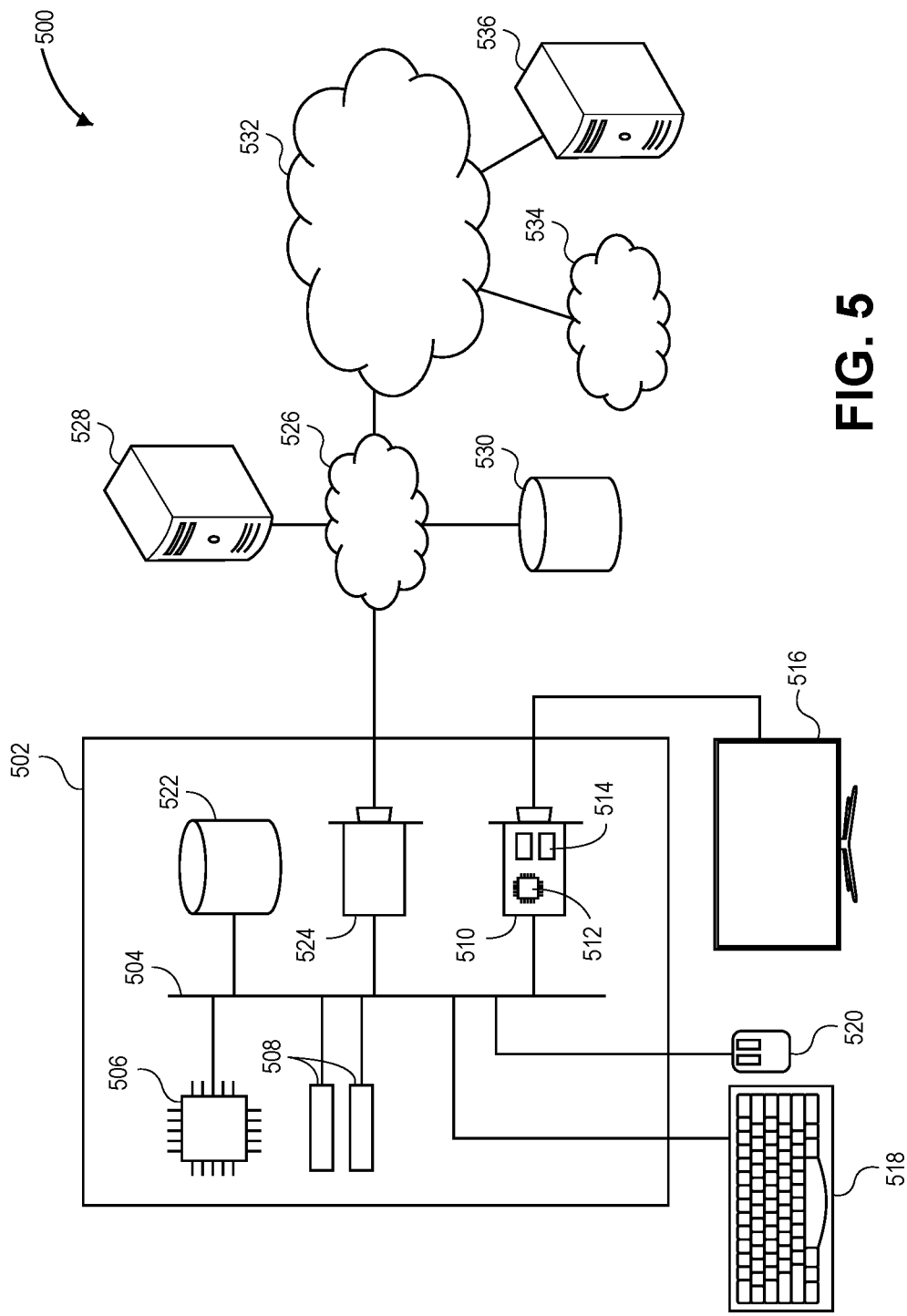
FIG. 5 depicts an exemplary hardware platform for certain embodiments of the invention.

FIG. 5 illustrates an exemplary hardware system that can form one element of certain embodiments of the invention is depicted, referred to generally by reference numeral 500. Computing device 502 can be a desktop computer, a laptop computer, a server computer, a mobile device such as a smartphone or tablet, or any other form factor of general—or special-purpose computing device. Depicted with computing device 502 are several components, for illustrative purposes. In some embodiments, certain components may be arranged differently or absent. Additional components may also be present. Included in computing device 502 is system bus 504, whereby other components of computing device 502 can communicate with each other. In certain embodiments, there may be multiple busses or components may communicate with each other directly. Connected to system bus 504 is central processing unit (CPU) 506. Also attached to system bus 504 are one or more random-access memory (RAM) modules 508.

Also attached to system bus 504 is graphics card 510. In some embodiments, graphics card 510 may not be a physically separate card, but rather may be integrated into the motherboard or the CPU 506. In some embodiments, graphics card 510 has a separate graphics-processing unit (GPU) 512, which can be used for graphics processing or for general purpose computing (GPGPU). Also on graphics card 510 is GPU memory 514. Connected (directly or indirectly) to graphics card 510 is computer display 516 for user interaction. In some embodiments no display is present, while in others it is integrated into computing device 502. Similarly, peripherals such as keyboard 518 and mouse 520 are connected to system bus 504. Like computer display 516, these peripherals may be integrated into computing device 502 or absent. Also connected to system bus 504 is local storage 522, which may be any form of computer-readable media and may be internally installed in computing device 502 or externally and removably attached.

Finally, network interface card (NIC) 524 is also attached to system bus 504 and allows computing device 502 to communicate over a network such as network 526. NIC 524 can be any form of network interface known in the art, such as Ethernet, ATM, fiber, Bluetooth, or Wi-Fi (i.e., the IEEE 802.11 family of standards). NIC 524 connects computing device 502 to local network 526, which may also include one or more other computers, such as computer 528, and network storage, such as data store 530. Local network 526 is in turn connected to Internet 532, which connects many networks such as local network 526, remote network 534 or directly attached computers such as computer 536. In some embodiments, computing device 502 can itself be directly connected to Internet 532.

Various computer programs representative of certain embodiments comprise a plurality of code segments executable by a computing device for performing the steps of various disclosed methods. The steps of the methods may be performed in the order discussed, or they may be performed in a different order, unless otherwise expressly stated. Furthermore, some steps may be performed concurrently as opposed to sequentially. Also, some steps may be optional. The computer programs may also execute additional steps not described herein. The computer programs, systems, and methods of embodiments may be implemented in hardware, software, firmware, or combinations thereof, which broadly comprises server devices, computing devices, and a communications network.

Computer programs consistent with the present teachings may be responsive to user input. As defined herein user input may be received from a variety of computing devices including but not limited to the following: desktops, laptops, calculators, telephones, smartphones, smart watches, in-car computers, camera systems, or tablets. The computing devices may receive user input from a variety of sources including but not limited to the following: keyboards, keypads, mice, trackpads, trackballs, pen-input devices, printers, scanners, facsimile, touchscreens, network transmissions, verbal/vocal commands, gestures, button presses or the like.

The monitor, server devices, and computing devices 502 may include any device, component, or equipment with a processing element and associated memory elements. The processing element may implement operating systems, and may be capable of executing the computer program, which is also generally known as instructions, commands, software code, executables, applications ("apps"), and the like. The processing element may include processors, microprocessors, microcontrollers, field programmable gate arrays, and the like, or combinations thereof. The memory elements may be capable of storing or retaining the computer program and may also store data, typically binary data, including text, databases, graphics, audio, video, combinations thereof, and the like. The memory elements may also be known as a "computer-readable storage medium" and may include random access memory (RAM), read only memory (ROM), flash drive memory, floppy disks, hard disk drives, optical storage media such as compact discs (CDs or CDROMs), digital video disc (DVD), and the like, or combinations thereof. In addition to these memory elements, the server devices may further include file stores comprising a plurality of hard disk drives, network attached storage, or a separate storage network.

The computing devices may specifically include mobile communication devices (including wireless devices), workstations, desktop computers, laptop computers, palmtop computers, tablet computers, portable digital assistants (PDA), smartphones, and the like, or combinations thereof. Various embodiments of the computing device may also include voice communication devices, such as cell phones and/or smartphones. In preferred embodiments, the computing device will have an electronic display operable to display visual graphics, images, text, etc. In certain embodiments, the computer program facilitates interaction and communication through a graphical user interface (GUI) that is displayed via the electronic display. The GUI enables the user to interact with the electronic display by touching or pointing at display areas to provide information to the monitor.

The communications network may be wired or wireless and may include servers, routers, switches, wireless receivers and transmitters, and the like, as well as electrically conductive cables or optical cables. The communications network may also include local, metro, or wide area networks, as well as the Internet, or other cloud networks. Furthermore, the communications network may include cellular or mobile phone networks, as well as landline phone networks, public switched telephone networks, fiber optic networks, or the like.

Computer programs consistent with the present teachings may be implemented on user computing devices or, alternatively, may run on one or more server devices. In certain embodiments, exemplary computer programs may be embodied by way of a stand-alone computer program (i.e., an "app") downloaded on a user's computing device or in a web-accessible program that is accessible by the user's computing device via the communications network. As used herein, the stand-alone computer program or web-accessible program provides users with access to an electronic resource from which the users can interact with various embodiments.

Many different arrangements of the various components depicted, as well as components not shown, are possible without departing from the scope of the claims below.

Embodiments have been described with the intent to be illustrative rather than restrictive. Alternative embodiments will become apparent to readers of this disclosure after and because of reading it. Alternative means of implementing the aforementioned can be completed without departing from the scope of the claims below. Certain features and sub combinations are of utility and may be employed without reference to other features and sub-combinations and are contemplated within the scope of the claims. Although various embodiments have been described with reference to the embodiments illustrated in the attached drawing figures, it is noted that equivalents may be employed, and substitutions made herein without departing from the scope of the recited claims.

Features described above as well as those claimed below may be combined in various ways without departing from the scope thereof. The following examples illustrate some possible, non-limiting combinations:

(A1) A photolithography device for imparting a predetermined geometric pattern on a surface of a substrate, the device comprising: a housing forming at least a partially enclosed space, a light source body comprising an array of light emitters, a base disposed below the light source body and configured for supporting the substrate having a photoresist layer thereon, and a controller for activating a predetermined number of individual light emitters within the array of light emitters corresponding to the predetermined geometric pattern. Each individual light emitter within the array of light emitters is selectively activatable to emit a light.

(A2) For the photolithography device denoted as (A1), further comprising a reduction lens disposed between the light source body and the base.

(A3) For the photolithography device denoted as (A1) or (A2), wherein the array of light emitters comprises a plurality of light-emitting diodes (LEDs), a plurality of quantum dots, or both.

(A4) For the photolithography device denoted as any of (A1) through (A3), wherein the array of light emitters is configured to emit light of varying wavelengths.

(A5) For the photolithography device denoted as any of (A1) through (A4), wherein the array of light emitters comprises LEDs configured for emitting light having a wavelength of about 180 nm to about 450 nm.

(A6) For the photolithography device denoted as any of (A1) through (A5), wherein the plurality of light emitters comprises quantum dots configured to emit light having a wavelength between about 2 nm to about 9 nm in wavelength.

(A7) For the photolithography device denoted as any of (A1) through (A6), wherein the array of light emitters is configured to emit light over an area that is larger than the substrate.

(A8) For the photolithography device denoted as any of (A1) through (A7), wherein the predetermined number of individual light emitters are configured to be activated simultaneously.

(A9) For the photolithography device denoted as any of (A1) through (A8), further comprising a sensor for measuring a wavelength of the light emitted from the array of light emitters.

(B1) A system for transferring a predetermined geometric pattern to a surface of a substrate through photolithography, comprising: a control system comprising at least one design file comprising the predetermined geometric pattern, and a photolithographic device. The photolithographic device comprising: a light source comprising a light source body and a plurality of light emitters, and a base for supporting a substrate having a photoresist on an upper surface thereof. Each light emitter within the plurality of light emitters is individually activatable to emit a light. The light source is configured for simultaneously emitting the light from the plurality of light emitters towards the substrate. The plurality of light emitters is selected for activation by instructions contained in the at least one design file.

(B2) For the system denoted as (B1), wherein the plurality of light emitters comprises quantum dots, light-emitting diodes (LEDs), or both.

(B3) For the system denoted as any of (B1) or (B2), wherein the plurality of light emitters is configured to emit light of varying wavelengths.

(B4) For the system denoted as any of (B1) through (B3), wherein the plurality of light emitters comprises quantum dots configured to emit light having a wavelength between about 2 nm to about 9 nm in wavelength.

(B5) For the system denoted as any of (B1) through (B4), further comprising a sensor for measuring a wavelength of the light emitted from the array of light emitters.

(B6) For the system denoted as any of (B1) through (B5), wherein the plurality of light emitters comprise LEDs configured for emitting light having a wavelength of about 180 nm to about 450 nm.

(B7) For the system denoted as any of (B1) through (B6), further comprising a reduction lens disposed between the light source body and the base.

(C1) A method of transferring a geometric pattern to the surface of a substrate, the method comprising: receiving, from a design file, a geometric pattern, selecting, from a light source having an array of light emitters, light emitters corresponding to the geometric pattern, exposing a predetermined area of a surface of a substrate having a photoresist layer with the light emitted from the activated light emitters, deactivating the activated light emitters to stop exposing the substrate with light, and removing an unexposed portion of the photoresist layer from the substrate. The predetermined area of the surface of the substrate corresponds to the geometric pattern. The exposing of the predetermined area of the surface of the substrate causes a chemical reaction between the light emitted and the photoresist layer exposed by the light.

(C2) For the method denoted as (C1), further comprising selecting a new substrate and a new design file for transferring a new geometric pattern to the new substrate.

(C3) For the method denoted as (C1) or (C2), wherein the array of light emitters comprises quantum dots, light-emitting diodes (LEDs), or both.

(C4) For the method denoted as any of (C1) through (C3), further comprising monitoring a wavelength of the light emitted from the light emitters using a sensor.

(C5) For the method denoted as any of (C1) through (C4), wherein an entirety of the geometric pattern is transferred to the surface of the substrate simultaneously.

(C6) For the method denoted as any of (C1) through (C5), wherein exposing the predetermined area of the substrate comprises an exposure time of less than one minute.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

The invention claimed is:

1. A mask-less photolithography device for imparting a predetermined geometric pattern on a surface of a substrate, the mask-less photolithography device comprising:
   an array of light emitters oriented to provide simultaneous exposure of all of an area of the substrate to be patterned;
   a first plurality of light emitters within the array of light emitters configured to emit a first wavelength;
   a second plurality of light emitters within the array of light emitters configured to emit a second wavelength; and
   a controller for selectively activating a subset of the array of light emitters corresponding to an entirety of the predetermined geometric pattern to be transferred by the mask-less photolithography device to the surface of the substrate.

2. The mask-less photolithography device of claim 1, further comprising a reduction lens disposed between the array of light emitters and the substrate.

3. The mask-less photolithography device of claim 1, wherein the array of light emitters comprises a plurality of light-emitting diodes (LEDs) configured for emitting light having a wavelength of approximately 180 nm to approximately 450 nm.

4. The mask-less photolithography device of claim 1, wherein the array of light emitters is configured to emit light over a surface area that is larger than the substrate for exposing an entire surface area of the substrate in emitted light.

5. The mask-less photolithography device of claim 1, further comprising a sensor for measuring at least one of a wavelength spectrum, an intensity, a magnitude, or an exposure time of the subset of the array of light emitters.

6. The mask-less photolithography device of claim 1, wherein the array of light emitters comprises a uniform size for selectively emitting from a uniform range of wavelength frequencies.

7. The mask-less photolithography device of claim 1, wherein the array of light emitters comprises a first size and a second size, wherein the first size of the array of light emitters emits from a first range of wavelengths and the second size of the array of light emitters from a second range of wavelengths.

8. A system for transferring a predetermined geometric pattern to a surface of a substrate through mask-less photolithography, comprising:
   a control system for controlling a mask-less photolithographic device and comprising at least one design file comprising the predetermined geometric pattern; and
   the mask-less photolithographic device comprising:
      an array of light emitters oriented to provide simultaneous exposure of all of an area of the substrate, the substrate having a photoresist on an upper surface thereof,
      wherein a subset of the array of light emitters is individually controllable to emit a variable wavelength range,
      wherein the array of light emitters is configured to transfer an entirety of the predetermined geometric pattern to the surface of the substrate,
      wherein the array of light emitters is selected for activation by instructions contained in the at least one design file,
      wherein a first plurality of light emitters is activated to emit a first wavelength and a second plurality of light emitters is activated simultaneously with the first plurality of light emitters to emit a second wavelength.

9. The system of claim 8, further comprising a sensor for measuring at least one of a wavelength spectrum, an intensity, a magnitude, or an exposure time of the light emitters.

10. The system of claim 8, further comprising a reduction lens disposed between the array of light emitters and the substrate.

11. The system of claim 8, further comprising a sensor for measuring at least one of a wavelength spectrum, an intensity, a magnitude, or an exposure time of the subset of the array of light emitters.

12. The system of claim 8, wherein the array of light emitters comprises a uniform size for selectively emitting from a uniform range of wavelengths.

13. The system of claim 8, wherein the array of light emitters comprises a first size and a second size, wherein the first size of the array of light emitters emits from a first range of wavelengths and the second size of the array of light emitters emits from a second range of wavelengths.

14. The system of claim 8, wherein the array of light emitters comprises a plurality of light-emitting diodes (LEDs) configured for emitting light having a wavelength of approximately 180 nm to approximately 450 nm.

15. The system of claim 8, wherein the array of light emitters is configured to emit over a surface area that is larger than the substrate for exposing an entire surface area of the substrate.

16. A method of transferring a geometric pattern to a surface of a substrate, the method comprising:
   receiving, from a design file, the geometric pattern;
   selecting, from a mask-less photolithography device having an array of light emitters, a subset of the array of light emitters corresponding to an entirety of the geometric pattern;
   activating the subset corresponding to the geometric pattern,
   wherein the light emitters are configured to emit at a range of different wavelengths,
   wherein a first plurality of light emitters of the subset is activated to emit at a first wavelength and a second plurality of light emitters of the subset is activated simultaneously with the first plurality of light emitters to emit at a second wavelength;
   providing simultaneous exposure to exposing a predetermined area of the surface of the substrate having a photoresist layer,
   wherein the predetermined area of the surface of the substrate corresponds to the entirety of the geometric pattern for transferring the entirety of the geometric pattern simultaneously;
   wherein providing simultaneous exposure of the predetermined area of the surface of the substrate causes a chemical reaction between the first wavelength, the second wavelength, and the photoresist layer;
   deactivating the subset of the array of light emitters to stop simultaneously exposing the substrate; and
   removing an unexposed portion of the photoresist layer from the substrate.

17. The method of claim 16, further comprising selecting a new substrate and a new design file for transferring a second geometric pattern to the new substrate.

18. The method of claim 16, further comprising monitoring at least one of a wavelength spectrum, an intensity, a magnitude, or an exposure time of the subset of the array of light emitters using a sensor.

19. The method of claim 16, wherein exposing the predetermined area of the substrate comprises an exposure time of less than five minutes.

20. The method of claim 16, wherein the array of light emitters comprises a first size and a second size, wherein the first size of the array of light emitters emits from a first range of wavelengths and the second size of the array of light emitters emits from a second range of wavelengths.

21. The method of claim 16, wherein the array of light emitters comprises a uniform size for selectively emitting light from a uniform range of wavelength.

22. The method of claim 16, wherein the array of light emitters comprises a plurality of light-emitting diodes (LEDs) configured for emitting light having a wavelength of approximately 180 nm to approximately 450 nm.

* * * * *